US010989731B2

(12) United States Patent
Kanamaru et al.

(10) Patent No.: US 10,989,731 B2
(45) Date of Patent: Apr. 27, 2021

(54) PHYSICAL QUANTITY SENSOR

(71) Applicant: Hitachi Automotive Systems, Ltd., Hitachinaka (JP)

(72) Inventors: Masatoshi Kanamaru, Tokyo (JP); Daisuke Maeda, Tokyo (JP); Masahide Hayashi, Hitachinaka (JP); Masashi Yura, Hitachinaka (JP); Akihiro Okamoto, Hitachinaka (JP)

(73) Assignee: HITACHI AUTOMOTIVE SYSTEMS, LTD., Hitachinaka (JP)

( * ) Notice: Subject to any disclaimer, the term of this patent is extended or adjusted under 35 U.S.C. 154(b) by 342 days.

(21) Appl. No.: 15/763,212

(22) PCT Filed: Aug. 3, 2016

(86) PCT No.: PCT/JP2016/072723
§ 371 (c)(1),
(2) Date: Mar. 26, 2018

(87) PCT Pub. No.: WO2017/056701
PCT Pub. Date: Apr. 6, 2017

(65) Prior Publication Data
US 2018/0275159 A1    Sep. 27, 2018

(30) Foreign Application Priority Data

Sep. 30, 2015    (JP) .............................. JP2015-192510

(51) Int. Cl.
*G01P 15/125*    (2006.01)
*B81B 3/00*    (2006.01)
(Continued)

(52) U.S. Cl.
CPC ............ *G01P 15/08* (2013.01); *B81B 3/0002* (2013.01); *B81B 3/0051* (2013.01);
(Continued)

(58) Field of Classification Search
CPC .... B81B 3/0002; B81B 3/0008; G01P 15/125
See application file for complete search history.

(56) References Cited

U.S. PATENT DOCUMENTS

2001/0025530 A1* 10/2001 Sakai .................... B81B 3/0008
73/514.32
2004/0231422 A1* 11/2004 Okada ................... B81B 3/0062
73/514.33
(Continued)

FOREIGN PATENT DOCUMENTS

BR    PI 0920481 A2    12/2015
CN    102955045 A    3/2013
(Continued)

OTHER PUBLICATIONS

Communication pursuant to Rule 114(2) EPC dated Oct. 25, 2018 in Application No. 16850878.6.
(Continued)

*Primary Examiner* — Herbert K Roberts
(74) *Attorney, Agent, or Firm* — Foley & Lardner LLP

(57) ABSTRACT

To provide a physical quantity sensor having excellent reliability by reducing the influence of a force applied from the outside. Disclosed is a physical quantity sensor, which has a weight or a movable electrode formed on a device substrate, and an outer peripheral section that is disposed to surround the weight or the movable electrode, said weight or movable electrode being displaceable in the rotation direction in a plane. When the weight or the movable electrode is displaced in the rotation direction in the plane, the physical quantity sensor is provided with a rotation space at the outer peripheral section of an end portion of the weight or the movable electrode, said end portion being in the direction viewed from the center position of the weight or the movable electrode.

11 Claims, 8 Drawing Sheets

(51) Int. Cl.
  *G01P 15/08* (2006.01)
  *H01L 29/84* (2006.01)
  *B81B 7/00* (2006.01)
(52) U.S. Cl.
  CPC .......... *B81B 7/0016* (2013.01); *G01P 15/125* (2013.01); *H01L 29/84* (2013.01); *B81B 2201/0235* (2013.01); *B81B 2203/0118* (2013.01); *B81B 2203/04* (2013.01); *B81B 2203/056* (2013.01); *B81B 2207/012* (2013.01); *G01P 2015/0862* (2013.01); *G01P 2015/0882* (2013.01)

(56) References Cited

U.S. PATENT DOCUMENTS

| | | | |
|---|---|---|---|
| 2014/0167189 A1 | 6/2014 | Steimle et al. | |
| 2015/0021719 A1* | 1/2015 | Tanaka | B81B 3/0013 257/415 |
| 2019/0277878 A1 | 9/2019 | Yoda | |

FOREIGN PATENT DOCUMENTS

| | | |
|---|---|---|
| JP | 2008-164471 A | 7/2008 |
| JP | 2010-210420 A | 9/2010 |
| JP | 2012-229989 A | 11/2012 |
| JP | 2013-036829 A | 2/2013 |
| JP | 2013-217835 A | 10/2013 |
| JP | 2014-149234 A | 8/2014 |

OTHER PUBLICATIONS

Extend European Search Report issued in corresponding European Application No. 16850878 dated May 3, 2019.
Office Action issued in corresponding Chinese Application No. 201680054606.0 dated Apr. 1, 2020, with English machine translation.
International Search Report with English translation and Written Opinion issued in corresponding application No. PCT/JP2016/072723 dated Nov. 29, 2016.

* cited by examiner (a)                     (b)

PHYSICAL QUANTITY SENSOR

TECHNICAL FIELD

The present invention relates to a structure of a physical quantity sensor used for measuring a physical quantity.

BACKGROUND ART

In recent years, by development of a refining technique by a MEMS technique, various sensors are provided which measure a physical quantity such as an acceleration speed and an angle speed and include such as a silicon material and a glass material. A physical quantity sensor using the MEMS technique can advantageously form a structure with a high aspect ratio (a ratio between an opening width and a processing depth) in comparison with a semiconductor device. In addition, a three-dimensional structure and a movable structure are formed including silicon by a dry etching method using a reactive ion etching (RIE) device using an induction coupled plasma (ICP) system which can form a groove with a high aspect ratio, and therefore, in comparison with machining, each type structure with high processing accuracy can be formed.

As a physical quantity sensor using such the MEMS technique, a capacitance type sensor described in JP 2014-149234 A (PTL 1) is known. In this capacitance type sensor, a vibration mass body is supported by a support portion on a substrate, and the vibration mass body is in a state of floating above the substrate. A torsion bar is formed in a central portion of the vibration mass body, and wings disposed on the left and right rotate about the torsion bar when an acceleration speed perpendicular to a planar direction of the substrate is applied. The acceleration speed is detected by a capacitance obtained from two electrodes formed on a fixed substrate. A periphery of the vibration mass body is surrounded by a frame portion integrated with the fixed substrate. At the outermost peripheral portion of the vibration mass body, a projected portion is formed for the purpose of preventing contact with the fixed substrate. Further, an extended portion arranged on the same plane as the vibration mass body is formed in a rod shape branching from the support portion into a plurality of portions. A purpose of the extended portion is to provide a function as a resistance portion for generating a damping torque due to friction with air, a medium, and the like when the vibration mass body rotates and as an adjustment portion of an introduction port of etching solution at the time of etching a sacrifice layer.

Further, in the semiconductor physical quantity sensor described in JP 2013-217835 A (PTL 2), a movable electrode portion supported swingably by a plurality of folding spring portions is disposed in an anchor portion. The movable electrode portion is disposed so as to be sandwiched between glass substrates disposed on and below the movable electrode portion and is floating only by four spring portions. A stopper is formed inside the movable electrode portion in directions parallel to and perpendicular to a movable direction of the movable electrode. A purpose of the stopper is to prevent sticking in case of collision. In addition, among a plurality of comb-tooth electrodes formed in the movable electrode portion, the comb-tooth electrodes disposed at the outermost ends are formed to be shorter than the other comb-tooth electrodes. Alternatively, a root portion of the comb-tooth electrode is formed thick. By adopting such a structure, by making a frequency higher than a frequency during a sensor manufacturing process, breakage from the root portion due to resonance of the comb-tooth electrodes disposed at the outermost ends is prevented.

CITATION LIST

Patent Literature

PTL 1: JP 2014-149234 A
PTL 2: JP 2013-217835 A

SUMMARY OF INVENTION

Technical Problem

Silicon is widely applied to materials formed by the MEMS process. Silicon is a brittle material and may be damaged when the silicon has such as a cutout and if a beam is displaced more than design.

In the capacitance type sensor described in PTL 1, a vibration mass body is supported by a support portion, and the sensor easily drives in the thickness direction of the vibration mass body like a seesaw. However, in the case where unexpected impact force of, for example, about 10000 G is applied from the outside, it can be predicted that an impact force by an acceleration speed is applied from multiple directions to the vibration mass body supported at one point. When the impact force is applied to the sensor, it is considered that the impact force is applied to the sensor in a rotation direction as an acceleration speed in addition to directions parallel to and perpendicular to the sensor. In the above-described structure, since the vibration mass body is supported at one point, the vibration mass body is easily displaced also in the rotation direction.

As a result, a displacement force is also generated in the rotation direction. Therefore there is a possibility that the vibration mass body and a frame portion are damaged by collision, or foreign matter of silicon is generated. Further, a projected portion formed in the outermost peripheral portion of the vibration mass body easily collides when rotated. Similarly, in an extended portion arranged on the same plane as the vibration mass body, rods plurally branching from a support portion have individual natural frequencies. Therefore, a tip portion of the extended portion is displaced significantly by an impact force, and a peripheral side wall portion may be damaged by collision, or foreign matter of silicon may be generated.

On the other hand, a movable electrode portion of the semiconductor physical quantity sensor disclosed in PTL 2 is floating in the air by four spring portions. In this structure, it can be predicted that the spring portion is largely displaced when an unexpected impact force of, for example, about 10000 G is applied from the outside, and inside the movable electrode portion, when the spring portion collides with a stopper formed in directions planarly parallel to and perpendicular to the movable electrode, the movable electrode portion may be damaged, or foreign matter of silicon may be generated due to repeated contact. In this case, since a tip portion of the stopper is projected, an impact force increases. Therefore, it can be predicted that damage due to collision is large.

An object of the present invention is to provide a physical quantity sensor which reduces the influence of externally applied force and has excellent reliability.

Solution to Problem

A physical quantity sensor includes a weight or a movable electrode formed on a device substrate, and an outer peripheral portion disposed so as to surround the weight or the movable electrode. The weight or the movable electrode is displaceable in a rotational direction on a plane. A rotational space is provided in an outer peripheral portion of an end portion as viewed from a center position of the weight or the movable electrode when the weight or the movable electrode is displaced in the rotation direction on a plane.

Advantageous Effects of Invention

According to the present invention, a physical quantity sensor which reduces the influence of externally applied force and has an excellent reliability can be provided.

DESCRIPTION OF EMBODIMENTS

Figure 1:
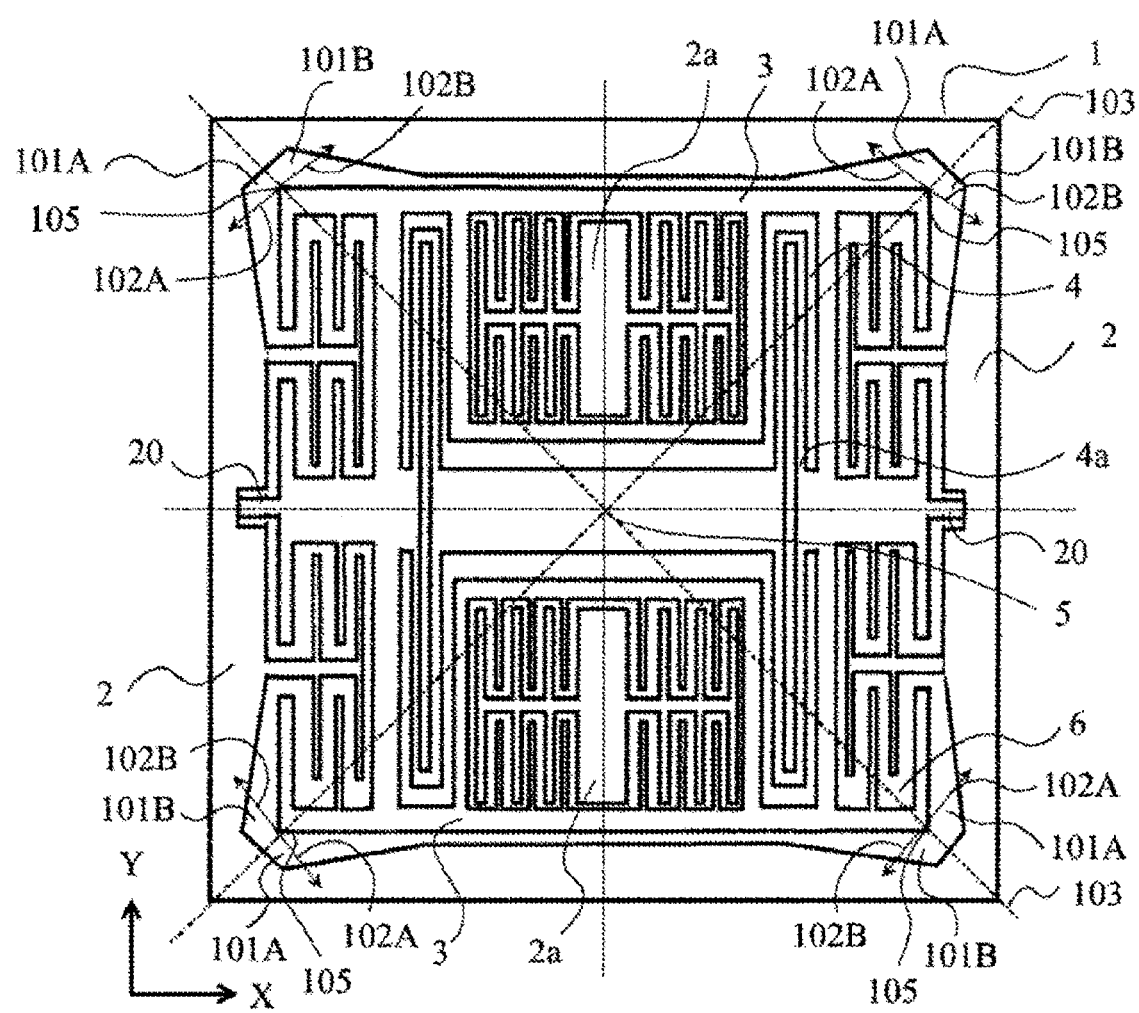
FIG. 1 is a plan view for explaining a first device substrate according to the present invention

An example of a structure of a physical quantity sensor according to the present invention will be described with reference to FIG. 1. FIG. 1 is a plan view indicating a device substrate structure of a capacitance type acceleration sensor for sensing an acceleration speed indicating an example of the present invention.

A weight or a movable electrode 3 is formed on a device substrate 1. A fixed electrode 2 for diagnostic and a fixed electrode 2a for detection are formed around the weight or the movable electrode 3. The weight or the movable electrode 3 is supported by two fixed beams 20 and is floating from a substrate on a lower surface. The horizontal direction in FIG. 1 indicates the X direction, and the vertical direction indicates the Y direction. A center position 5 indicates a center of the weight or the movable electrode 3. A gap 6 is formed between the fixed electrode 2 of an outer frame and the weight or the movable electrode 3 and is generally at atmospheric pressure to enhance a damping effect.

In such a sensor structure, silicon is used as a main material, and a processing technique such as the MEMS technique including a dry etching method in which a cross section is vertically processed and a wet etching method in which minute step processing is performed. For example, a minimum gap formed in the weight or the movable electrode 3 is about 3 μm.

In sensing of a physical quantity of an acceleration speed, a gap between the fixed electrode and the movable electrode changes when an acceleration speed is applied. An acceleration speed is detected by detecting the variation of the gap between electrodes by the acceleration speed by an electrostatic force.

Specifically, when the acceleration speed is applied to the acceleration sensor from the X direction, the weight or the movable electrode 3 is displaced, and a gap distance from the fixed electrode 2a changes. The displaced weight or movable electrode 3 is pulled back to the original position by a spring beam 4.

Generally, the relationship between equations (1) and (2) is important for acceleration speed detection. Here, F indicates a force, m indicates a weight of the weight or the movable electrode, a indicates an acceleration speed, k indicates a spring constant, and x indicates displacement of a spring beam in the case where an acceleration speed is applied. For example, when the weight m of the weight or the movable electrode and the spring constant k change due to breakage or the like, it is difficult to obtain the acceleration speed accurately.

$$F = m \times a \quad (1)$$

$$F = k \times x \quad (2)$$

When an unexpectedly large impact force is applied to the physical quantity sensor of FIG. 1 from the outside, it can be predicted that not only the weight or the movable electrode 3 supported at two points moves in the X direction and the Y direction but also the weight or the movable electrode moves in a rotation direction on a plane. In this case, a direction rotating about an axis perpendicular to a plane of the weight or the movable electrode is indicated. At that time, an end portion 105 furthest from the center position 5 of the weight or the movable electrode 3 on a diagonal line 103 passing through the center position moves in a rotation direction 102A or 102B on a plane and collides with the fixed electrode 2 on a side surface.

At the end portion 105 furthest from the center position of the weight or the movable electrode, when the weight or the movable electrode moves due to an impact force in the rotation direction on a plane, four points of the end portion 105 simultaneously move. At this time, a beam for detection or diagnostic formed inside the weight or the movable electrode 3 is not damaged. This is because, in rotation of the weight or the movable electrode due to the impact force, a portion away from the center position of the weight or the movable electrode is most largely displaced. On the other hand, at a portion close to the center position, a centrifugal force becomes small, and a displacement amount also becomes small. In addition, the beam formed inside the weight or the movable electrode 3 is formed in an elongated shape, and the entire beam is soft and easily deformed.

Further, when the weight or the movable electrode 3 and the fixed electrode 2 collide with each other due to unexpectedly large impact force, foreign matter may be generated by friction due to breakage due to collision or friction by contact.

When the breakage occurs, or the foreign matter is generated, a broken object may be caught in the gap 6 between the movable electrode 3 and the fixed electrode 2, and satisfactory sensing cannot be obtained. Further, since the weight of the weight or the movable electrode changes due to the breakage, the accuracy of acceleration speed detection is affected. As a result, reliability may be reduced.

Therefore, in the present invention, spaces 101A and 101B are provided around the end portion 105 furthest from the center position of the weight or the movable electrode of the fixed electrode 2 to avoid collision. By disposing the spaces 101A and 101B, even when an unexpectedly large impact force is applied to the physical quantity sensor from the outside, contact between the weight or the movable electrode 3 and the fixed electrode 2 can be avoided. This makes it possible to suppress occurrence of silicon foreign matter due to breakage caused by collision or due to repeated contact and to provide a physical quantity sensor with high reliability strong against forces applied from the outside.

To avoid contact between the weight or the movable electrode 3 and the fixed electrode 2, a gap between the weight or the movable electrode 3 and the fixed electrode 2 on an outer peripheral portion may be increased.

Figure 2:
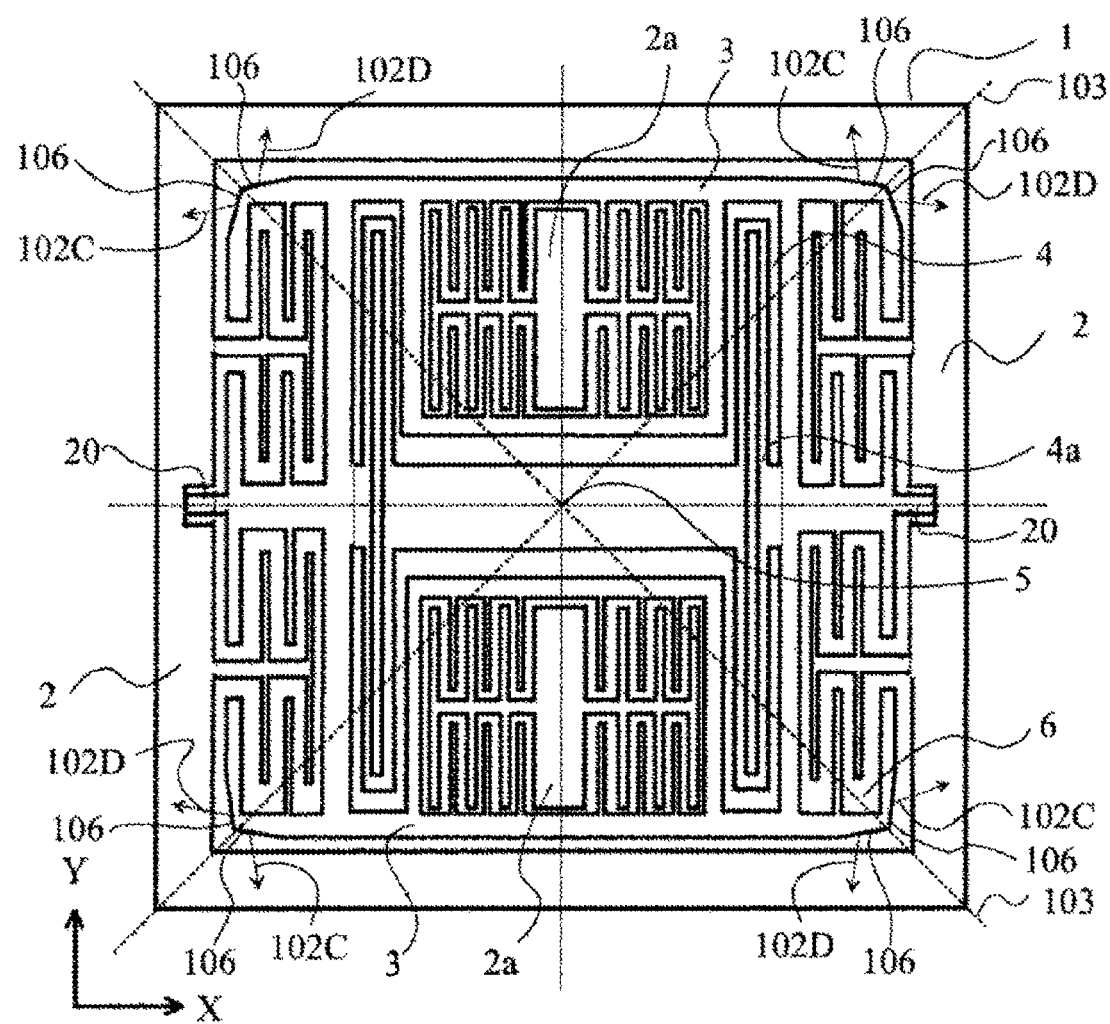
FIG. 2 is a plan view for explaining a second device substrate according to the present invention

Next, a structural example of a second physical quantity sensor according to the present invention will be described with reference to FIG. 2. In the structure indicated in FIG. 2, a corner cutting structure 106 is formed at a periphery of an end portion furthest from the center position 5 of the weight or movable electrode 3 on the diagonal line 103 passing through the center position.

As a result, even when an unexpectedly large impact force is applied from the outside to the physical quantity sensor, even if the weight or the movable electrode moves in a rotation direction 102C or 102D on a plane, contact between the weight or the movable electrode 3 and the fixed electrode 2 can be avoided. In this manner, in this embodiment, it is possible to provide a structure for preventing contact to either the fixed substrate or the weight or the movable electrode when an unexpectedly large impact force is applied from the outside. This makes it possible to suppress occurrence of silicon foreign matter due to breakage caused by collision or due to repeated contact and to provide a physical quantity sensor with high reliability strong against forces applied from the outside.

Figure 3:
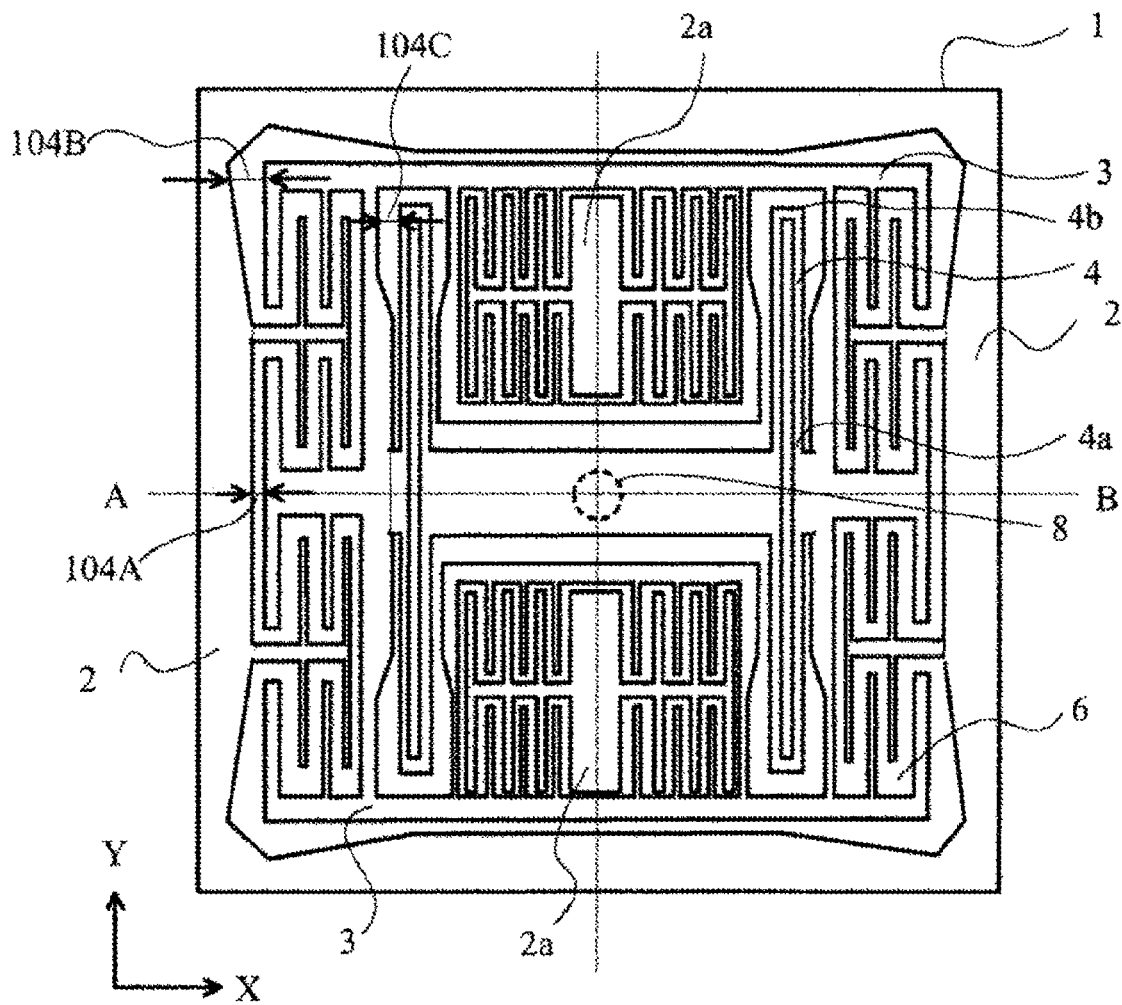
FIG. 3 is a plan view for explaining a third device substrate according to the present invention

Next, a structural example of a third physical quantity sensor according to the present invention will be described with reference to FIG. 3. In the structure of FIG. 3, the weight or the movable electrode 3 is supported at one point by a support column 8 from a substrate disposed on a lower surface. Therefore, when an unexpectedly large impact force is applied from the outside, the weight or the movable electrode can easily move in a rotation direction on a plane.

A distance between the weight or the movable electrode 3 and the fixed electrode 2 disposed around the weight or the movable electrode 3 is determined by arranging a gap 104A closest from the support column 8 which is the center position of the weight or the movable electrode in the X direction and the Y direction, and a gap 104B furthest in a diagonal direction from the support column is arranged to be large.

As described above, when the weight or the movable electrode is displaced in a rotation direction on a plane, since the amount of displacement is different depending on a distance from the center, it is effective for preventing collision or contact.

On the other hand, a spring beam 4 is formed inside the weight or the movable electrode 3, and with a root 4a of the spring beam as a fulcrum, a tip portion 4b of the spring beam easily moves independently. Therefore, when an unexpectedly large impact force is applied from the outside, the weight or the movable electrode 3 vibrates at a natural resonance frequency. When the vibration occurs, collision or contact occurs inside the weight or the movable electrode 3, and the spring beam may be damaged, or foreign matter of silicon may be generated due to repeated contact. Since a dry etching method is applied to processing of the weight or the movable electrode, scallops are formed on a contact section, and unevenness exists on the contact section. As a result, abrasion (rubbing) occurs when silicon is brought into contact with each other, and silicon foreign matter is generated. Furthermore, the tip portion of the spring beam does not necessarily move in parallel, and there is a possibility that it collides with a side surface while moving vertically. In this case, there is a possibility that the spring beam contacts a corner portion of the side surface at an angle, and it is conceivable that foreign matter of silicon is generated.

Therefore, in the structure of FIG. 3, a gap of a gap 104C is provided on a side surface of the tip portion 4b of the spring beam to prevent collision or contact. This makes it possible to suppress occurrence of silicon foreign matter due to breakage caused by collision or due to repeated contact and to provide a physical quantity sensor with high reliability strong against forces applied from the outside.

Figure 4:
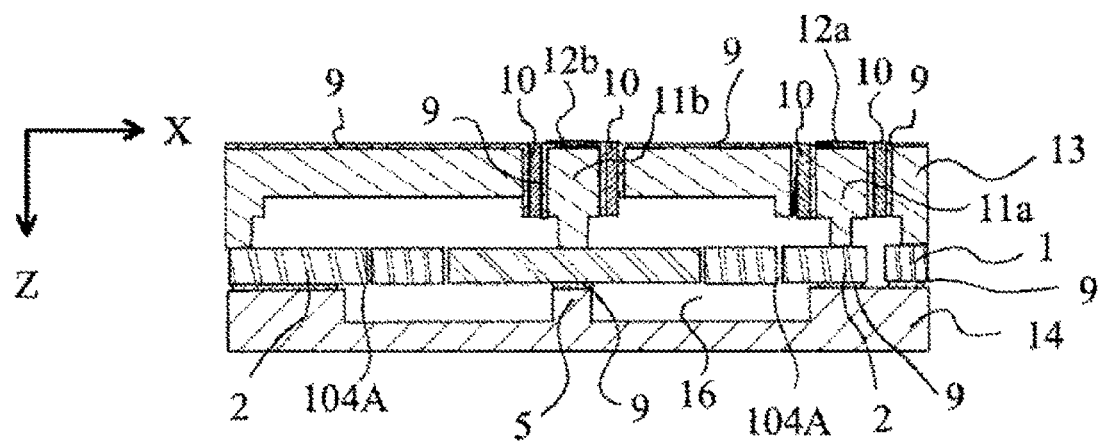
FIG. 4 is a cross-sectional view for explaining the third device substrate according to the present invention

FIG. 4 indicates a detailed cross-sectional structure. The device substrate 1 has at least a three-layer structure sandwiched between a fixed substrate 14 on a lower surface and an electrode substrate 13. The weight or the movable electrode is supported by a support column 5, and portions other than the support column are floating in midair. The support column is formed integrally with the fixed substrate 14. On the fixed substrate 14, SiO2 made of an oxide film 9 is used as a bonding portion, and the device substrate 1 is formed thereon. The electrode substrate 13 is disposed at an upper portion of a device layer. A sensing space 16 for measuring the acceleration speed in FIG. 4 is a sealed space. A sensing space is an atmosphere having a pressure atmosphere of about 10000 to 50000 Pa in a sealed space with the fixed substrate 14 and the electrode substrate 13 arranged vertically.

On the device substrate 1, the fixed electrode 2 and the weight or the movable electrode 3 are formed. A plurality of comb teeth is formed with a gap of several microns.

A pressure atmosphere in an acceleration sensor is sealed at a vacuum degree of approximately 10000 to 50000 Pa. This is because as a temperature increases, a pressure in a sealed space increases, according to a bonding temperature in the sealed space. In this case, the case where sealing might be peeled depending on a bonding method. Therefore, it is necessary to make a depressurized state in advance.

The electrical exchange between the device substrate 1 and the outside is such that the fixed electrode 2 of the device substrate 1 is connected to a low-resistance silicon 11a disposed inside the electrode substrate 13 and is connected to an electrode pad 12a formed thereon, and electrical exchange with the outside is performed via the electrode pad 12a. Similarly, the weight or the movable electrode 3 for detection is connected to the low-resistance silicon 11b disposed inside the electrode substrate 13 and is connected to the electrode pad 12b formed thereon. Then, electric exchange is performed via the electrode pad 12a. Note that the electrode pad can be freely moved in position by using metal wiring.

Peripheries of the low resistance silicon 11 formed in the electrode substrate 13 are electrically insulated by an oxide film 9 such as SiO2, and peripheries of the peripheries are sealed by a filling material 10 such as Poly-Si.

For the above physical quantity sensor structure, a direct bonding method of silicon can be applied. By the direct bonding of silicon, first, a hydrophilic treatment is performed on a silicon wafer or a silicon wafer in which an oxide film is formed on a surface, and the silicon wafers are stuck at about room temperature. Consequently, two silicon wafers stuck by hydrogen-bond are bonded. In this state, a bonding strength is still week. Therefore, a heating process is performed at a temperature of 900 to 1100° C. The heating process is a strong bonding method in which a siloxane bond state is created, and finally a strong bond state between silicon and silicon is obtained.

The bonding method is not limited to the above bonding method, and metal bonding may be applied as a bonding method of substrates. For example, a metal bonding method such as eutectic bonding of gold and silicon, eutectic bonding of gold and tin, and eutectic bonding of aluminium and germanium can be used.

Figure 5:
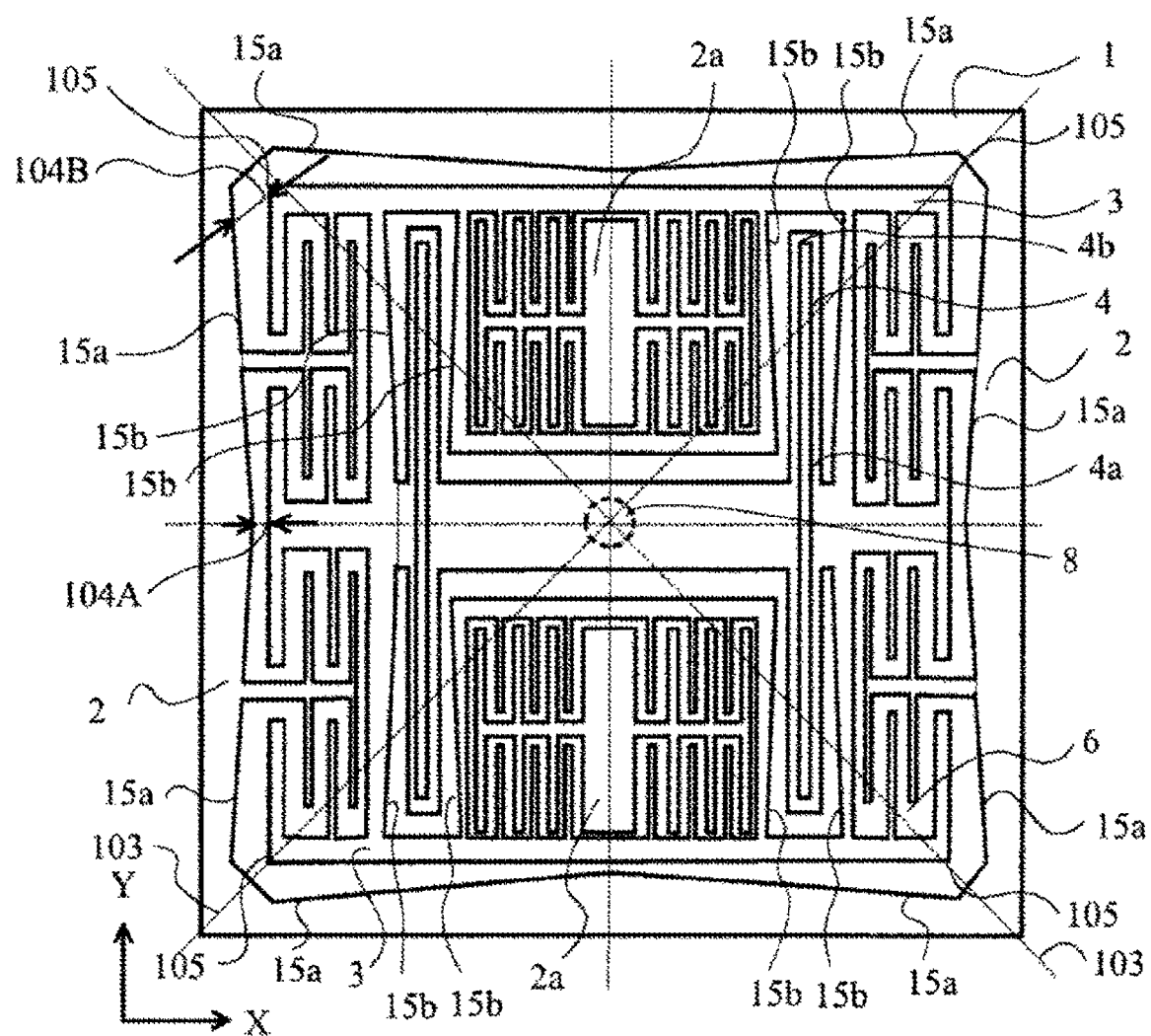
FIG. 5 is a plan view for explaining a fourth device substrate according to the present invention

Next, a structural example of a fourth physical quantity sensor according to the present invention will be described with reference to FIG. 5. In the structure of FIG. 5, as in FIG. 4, the weight or the movable electrode 3 is supported at one point by the support column 8 from the substrate arranged on the lower surface.

In the fixed electrode 2 disposed around the weight or the movable electrode 3, a position in the X direction and the Y direction from the support column 8 which is a center position of the weight or the movable electrode is closest in the gap 104C between the weight or the movable electrode and the fixed electrode, and the end portion 105 of the weight or the movable electrode which is positioned furthest on the diagonal line 103 from a support column is the gap 104D in which a distance in the case where the weight or the movable electrode displaces in the direction of rotation on a plane is wide. The tapered slope 15 is formed from the gap 104C to the gap 104D.

An unexpectedly large impact force is applied from the outside to the tapered slope 15a, and a gap can be formed which prevents collision with or contact with the tapered slope when a weight or a movable electrode is displaced in the rotation direction on a plane.

On the other hand, it is conceivable that displacement can be performed by a vibration frequency different from that of the weight or the movable electrode 3 by disposing the tapered slope 15b on both side surfaces of the spring beam 4 in the weight or the movable electrode. This is because the mass of the weight or the movable electrode and the mass and the movable range of the spring beam are different. Specifically, the weight or the movable electrode moves in the rotation direction around an axis perpendicular to the column, whereas the root of the spring beam is a fulcrum in the movement, as viewed on a plane.

How the weight or the movable electrode displaces when an unexpectedly large impact force is applied from the outside will be explained by applying the schematic view of FIG. 6.

Figure 6:
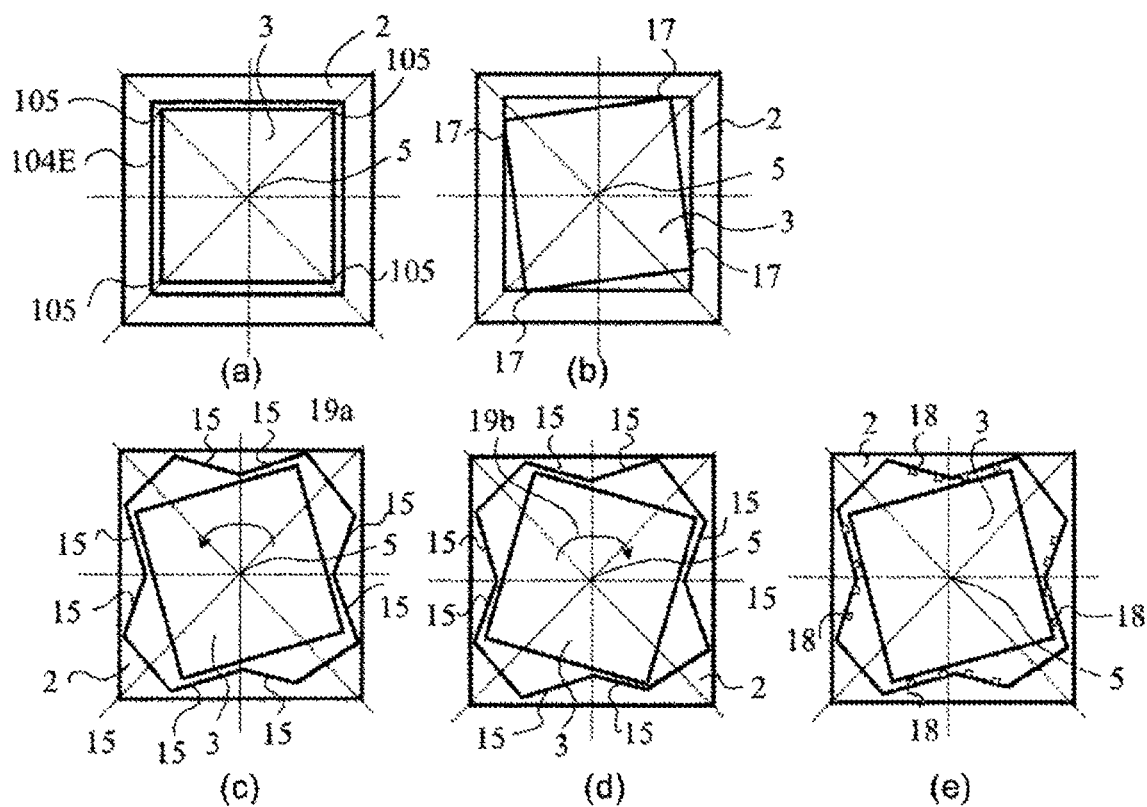
FIG. 6 is a plan view for explaining displacement of a weight or a movable electrode

In FIG. 6 (a), the fixed electrode 2 is disposed with a gap 104E around the weight or the movable electrode 3. When an impact force is applied, as indicated in FIG. 6 (b), the weight or the movable electrode 3 is displaced in the rotation direction on a plane, and the end portion 105 furthest from the center position of the fixed electrode 2 and the weight or the movable electrode collide or contact each other. On the other hand, in FIGS. 6 (c) and 6(d), since the tapered slope indicated in FIG. 5 is formed, even when the weight or the movable electrode is rotated leftward 19a or rightward 19b, the fixed electrode can be brought into contact with the side face of the weight or the movable electrode. When the surface contact is made in this way, there is an effect of dispersing the force, and therefore breakage can be prevented. At this time, there is a possibility that the weight or the movable electrode and the fixed electrode are fixed by surface contact. Therefore, in this embodiment, as illustrated in FIG. 6 (e), minute projection 18 may be formed on the tapered slope 15.

Figure 7:
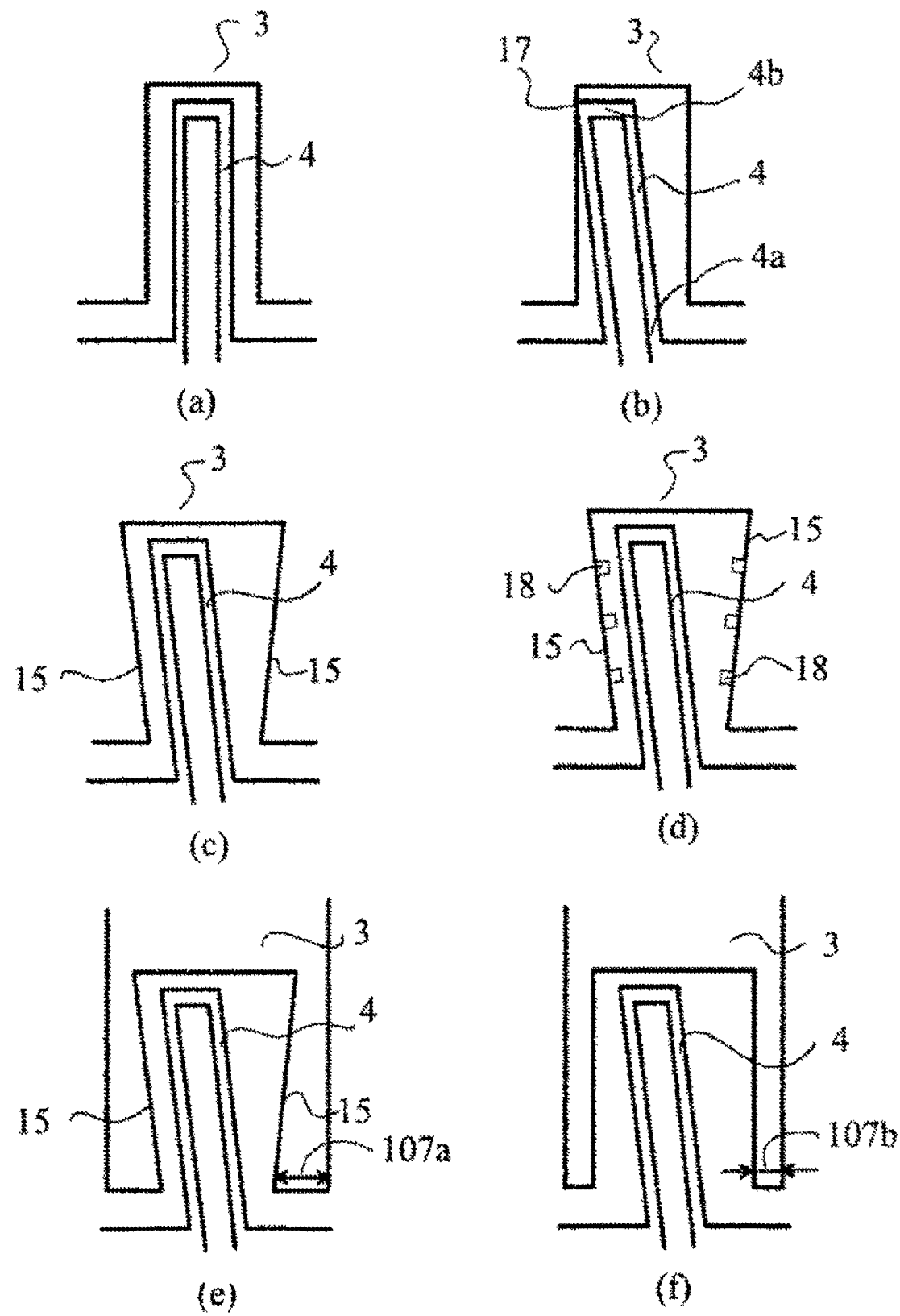
FIG. 7 is a plan view for explaining displacement of a spring beam.

On the other hand, the details of the spring beam portion disposed in the weight or the movable electrode will be described with reference to FIG. 7. FIG. 7(a) illustrates a spring beam in a stationary state. When an impact force is applied, as indicated in FIG. 7(b), with the root 4a of the a spring beam 4 as a fulcrum, the tip portion 4a of the spring beam largely vibrates from side to side. For this reason, the spring beam generates foreign matter due to breakage or friction due to contact. As a result of an analysis, it is predicted that a spring beam with a length of 400 μm and a width of 6 μm is in resonance at frequencies 17630 Hz and 13764 Hz and comes into contact with the side surface.

In this embodiment, as indicated in FIG. 7(c), a tapered slope 15 can be formed on the side surface portion of the spring beam. In this structure it is possible to make contact at the side surface of the spring beam. When the surface contact is made in this way, there is an effect of dispersing the force, and therefore breakage can be prevented. At this time, there is a possibility that the weight or the movable electrode and the fixed electrode are fixed by surface contact. Therefore, in this embodiment, as indicated in FIG. 7(d), the minute projection 18 may be formed on the tapered slope 15.

The structure of the tapered slope 15 can also maintain the strength therearound. As indicated in FIG. 7(f), a structure that forms a large space is also conceivable. However, at that time, when the total size of the weight or the movable electrode is constant, the width 107b of the side surface of the spring beam portion becomes narrow. In this case, there is a possibility that the strength of the weight or the movable electrode partially deteriorates, and it is easily broken by vibration such as an acceleration speed applied from the outside. On the other hand, in FIG. 7(e), the width 107a for avoiding breakage can be formed on the side surface and the weight or the movable electrode is not easily broken, and the overall dimensions of the weight or the movable electrode can be reduced.

An object of the present embodiment is to prevent breakage due to collision or contact in the case where an unexpected impact force is applied. Therefore, this structure can be applied for collision or contact between the spring beam formed inside the weight or the movable electrode and its side surface and also can be applied to structures other than the spring beam.

Figure 8:
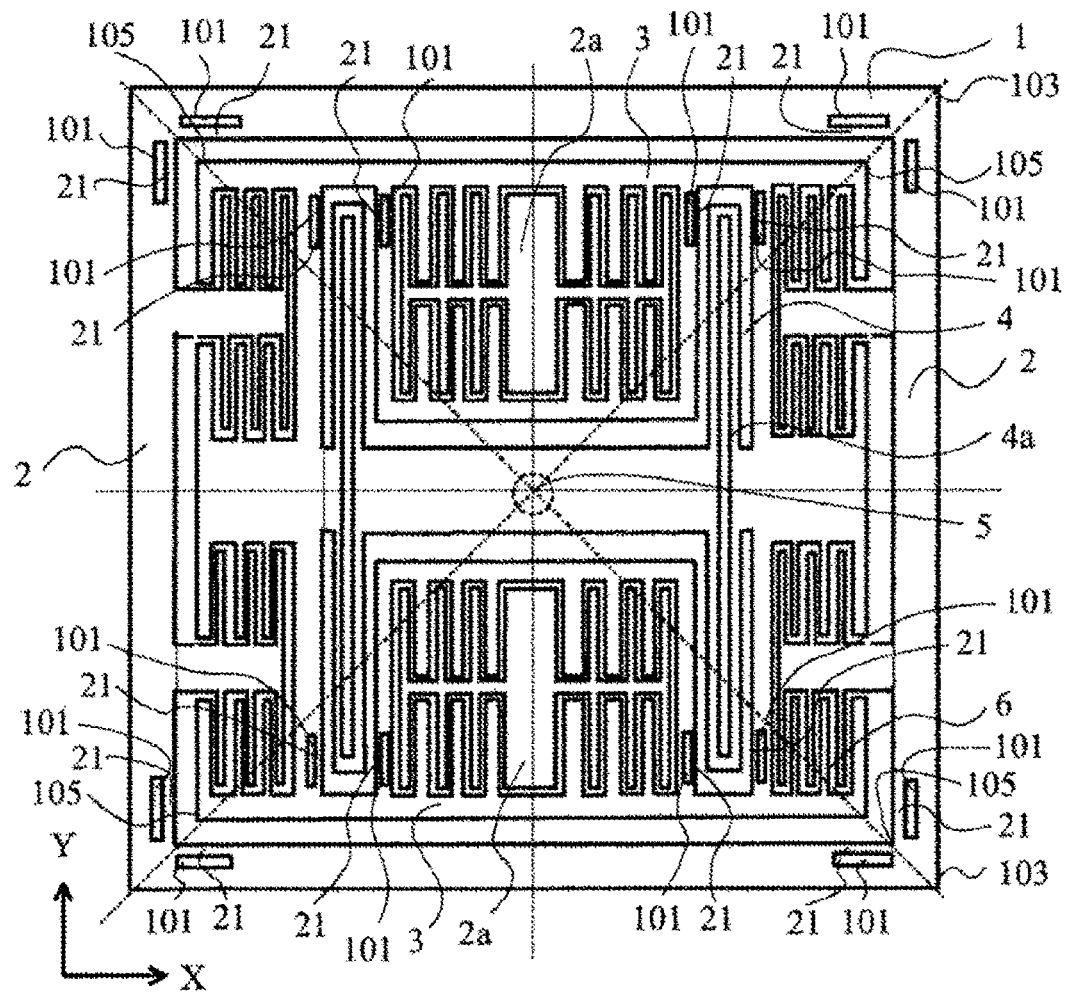
FIG. 8 is a plan view for explaining a fifth device substrate according to the present invention.

Next, a structural example of a fifth physical quantity sensor according to the present invention will be described with reference to FIG. 8. In the present embodiment, when the weight or the movable electrode 3 is displaced in a rotation direction on a plane, a buffer portion is provided at a position colliding with or coming into contact with a fixed electrode portion.

More specifically, the both ends supported beams 21 are provided on a side surface of the end portion 105 on the diagonal line 103 passing through the center 5 of the weight or the movable electrode 3. At the same time, the both ends supported beams 21 are provided on the side surface portion of the tip portion of the spring beam 4 inside the weight or the movable electrode. Spaces 101 are formed on the side surfaces of the both ends supported beam 21. The space 101 can buffer an impact force.

Figure 9:
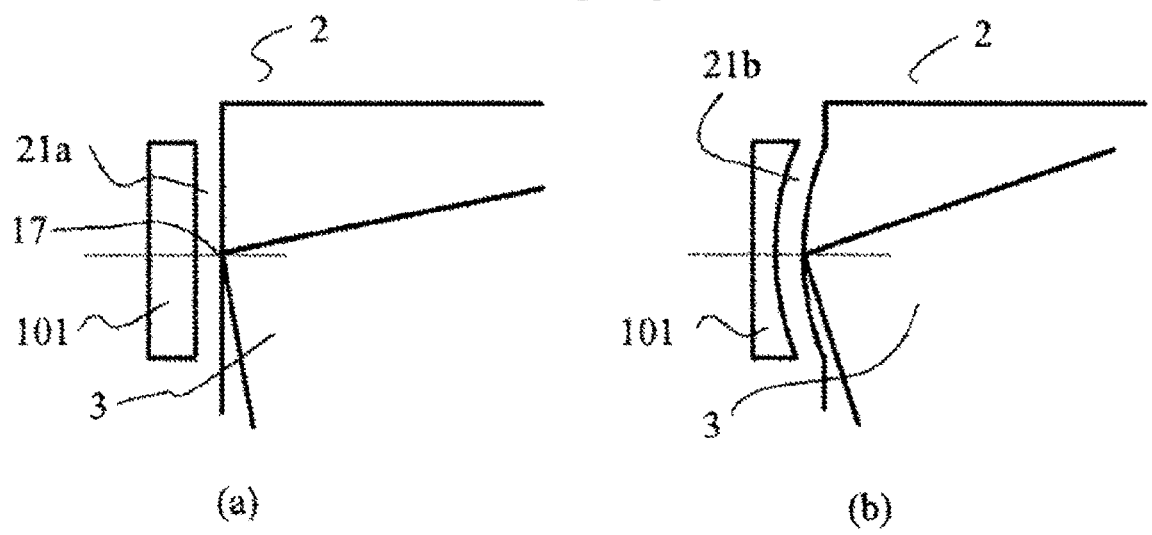
FIG. 9 is a plan view for explaining displacement of a weight or a movable electrode in the fifth device substrate according to the present invention

Deformation at the time of contact will be described with reference to FIG. 9. In FIG. 9(a), when the weight or the movable electrode 3 collides with or comes into contact with the fixed electrode 2 on the outer peripheral portion, it collides or comes into contact with a contact portion 17. In this case, when contacting the both ends supported beam, as indicated in FIG. 9 (b), the both ends supported beam 21b deforms largely in a bow shape (circular arc), and an impact force can be absorbed. At this time, the structure that the contact portion is brought into contact with the center portion of the both ends supported beam is preferable because rigidity against deformation of the both end supported beam is large. In addition, the structure that can absorb the impact force by softly displacing the both ends supported beam is preferable. The contact portion of the weight or the movable electrode 3 has preferably a shape having no corners as much as possible and having a large curvature radius. Although it looks like point contact in FIG. 9, since structures are actually included also in the depth direction, the contact portion is brought into line contact. In this structure, since the space 101 needs to be formed larger than the amount of displacement at the time of contact, it is effective for miniaturization.

On the other hand, from a process viewpoint, it is possible to form the space 101 by dry etching at the same time when forming a large number of comb teeth structures by dry etching, and the shape of the both ends supported beam can also be easily designed by designing a shape of the space on a photo mask.

As described above, in this embodiment, by providing a buffer portion at a position of colliding with or coming into contact with the fixed electrode portion, it is possible to suppress that silicon foreign matter is generated due to breakage caused by collision or repeated contact and to provide a physical quantity sensor which is highly reliable against a force applied from the outside.

Figure 10:
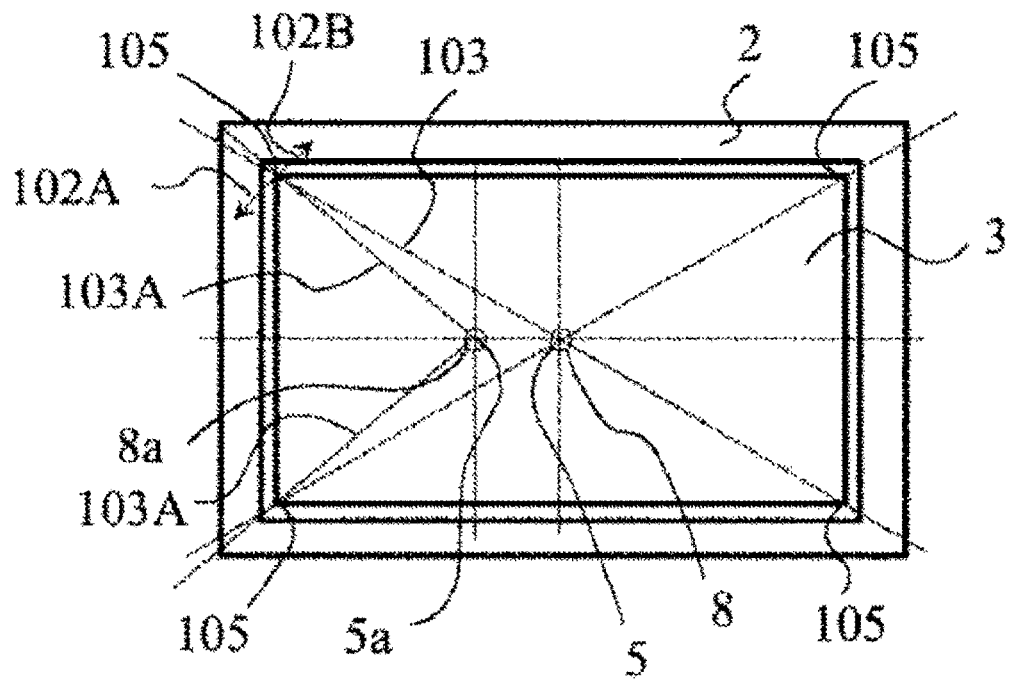
FIG. 10 is a plan view for explaining a shape of the weight or the movable substrate of the device substrate.

FIG. 10 indicates a case where two fulcrums support the weight or the movable electrode, for example. In the fixed electrode 2, the weight or the movable electrode 3 is supported by the support columns 8 and 8a. When an impact force is applied to such a structure, on the right side of the weight or the movable electrode 3, at an end furthest from a center point 5 of the weight or the movable electrode on the diagonal line 103 extending from the center point, the weight or the movable electrode can move in a rotation direction on a plane, and on the left side of the weight or the movable electrode 3, at an end furthest from a center point 5a of the weight or the movable electrode on the diagonal line 103A extending from the center point, the weight or the movable electrode displaces in rotation directions 102A and 102B on a plane. Therefore, in this embodiment, a gap of the space or an angle of the tapered slope may be changed by difference of the displacement amount.

As described above, regardless of the position where the weight or the movable electrode is supported, when there is a possibility that the weight or the movable electrode is movable in a rotation direction on a plane by an impact force and comes into contact with an outer peripheral portion, each structure described in each embodiment can be applied.

Figure 11:
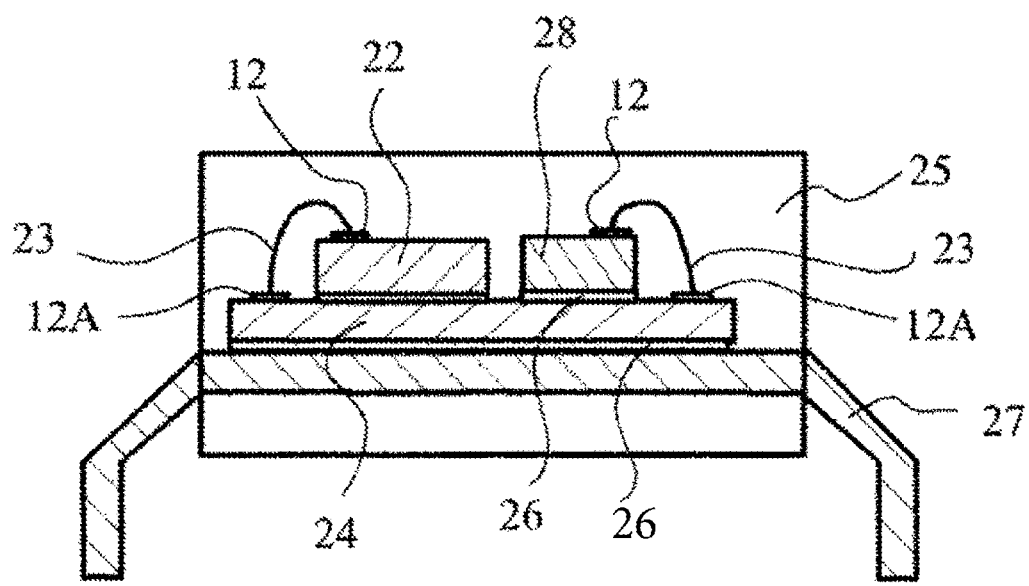
FIG. 11 is an external view of a package mounting the device substrate according to the present invention.

Next, FIG. 11 indicates an example of a package structure. A control LSI 24 is disposed on a lead wire 27 via an adhesive layer 26, an acceleration sensor 1 and an angular velocity sensor 22 are disposed thereon via an adhesive layer 26, and peripheries of the sensors are packaged with a resin mold 25. By disposing the acceleration sensor 1 and the angular velocity sensor 22 in one package with the control LSI 24, it is possible to provide a sensor resistant to an impact force from the outside.

In the electrical exchange with the outside, the electrode pads 12 of the acceleration sensor 1 and the angular velocity sensor 22 are connected to the electrode pad 12A on the control LSI 24 by a gold wire 23, and the control LSI and the lead wire 27 are also connected by a gold wire (not illustrated).

The above-described configuration is not limited to the acceleration sensor. In the case where a movable portion and an outer peripheral portion are partially in contact with each other by an impact force, by applying each structural example indicated above, various sensors having excellent reliability can be provided.

In the package, not only a combination with an angular velocity sensor but also a combination of a high-sensitivity acceleration sensor and a low-sensitivity acceleration sensor can be provided, and different acceleration speeds can be simultaneously measured.

Since this acceleration sensor is excellent in reliability even when an unexpected impact force is applied, it can be applied to many products such as automobile sensors and elevators to which vibration is applied.

Although various structures have been described above, the present invention is not limited to the above-described examples. It is easy for a person skilled in the art to understand that various modifications can be made within the scope of the invention described in the claims.

REFERENCE SIGNS LIST 1 device substrate
2, 2a fixed electrode
3 weight or movable electrode
4 spring beam
5 center position
6 gap
7 corner cutting portion
8 support column
9 oxide film
10 filling material
11 low-resistance silicon
12 electrode pad
13 electrode substrate
14 fixed substrate
15 tapered slope
16 sensing space
17 collided or contacted portion
18 projection
19 rotation direction
20 fixed beam
21 both ends supported beam
22 angular velocity sensor
23 gold wire
24 control LSI
25 resin mold
26 adhesive layer
27 lead wiring
28 accelerator sensor
101 space
102 direction
103 diagonal line
104 gap between weight or movable electrode and fixed electrode
105 end of weight or movable electrode
106 corner cutting structure
107 width

The invention claimed is:
1. A physical quantity sensor, comprising:
a weight or a movable electrode formed on a device substrate; and an outer peripheral portion disposed so as to surround the weight or the movable electrode, wherein the weight or the movable electrode is displaceable in a rotation direction on a plane, and a rotational space is disposed in an outer peripheral portion of an end portion of the weight or the movable electrode as viewed from a center position of the weight or the movable electrode when the weight or the movable electrode displaces in rotation direction on the plane, wherein the weight or the movable electrode formed on the device substrate is supported by a fixed substrate at one point, the weight or movable electrode comprises corner regions and edge regions;

the plane comprises a first direction and a second direction perpendicular to the first direction;

the first direction and the second direction are each parallel to outer sides of the weight or the movable electrode;

a first gap, in the first direction and in one of the edge regions, between the weight or movable electrode and a fixed electrode disposed in the outer peripheral portion in parallel with the end portion, a line passing through the first gap in the first direction passes through a center position of the weight or movable electrode;

a second gap, in the first direction and in one of the corner regions, between the weight or movable electrode and the fixed electrode; and the second gap is larger than the first gap.

2. The physical quantity sensor according to claim 1, wherein a chamfered portion is provided at the end portion.

3. The physical quantity sensor according to claim 1, wherein the distance of the first gap and the distance of the second gap extend in a tapered shape.

4. The physical quantity sensor according to claim 3, wherein a projection is provided on the tapered slope.

5. The physical quantity sensor according to claim 1, wherein, a distance of a third gap adjacent to a fulcrum of a spring beam formed inside the weight or the movable electrode of the device substrate is thinner than a distance of a fourth gap adjacent to a tip portion of the spring beam.

6. The physical quantity sensor according to claim 5, wherein the distance of the third gap and the distance of the fourth gap extend in a tapered shape.

7. The physical quantity sensor according to claim 6, wherein a projection is provided on the tapered slope.

8. The physical quantity sensor according to claim 1, wherein the weight or the movable electrode formed on the device substrate is supported by a fixed substrate at one point, and a buffer portion is provided in the outer peripheral portion opposed to an end portion of the weight or the movable electrode positioned furthest on a diagonal line from the supporting point is provided.

9. The physical quantity sensor according to claim 1, wherein a buffer portion is provided on a side wall positioned furthest from a fulcrum of a spring beam formed inside the weight or the movable electrode of the device substrate.

10. The physical quantity sensor according to claim 8, wherein the buffer portion consists of both ends supported beam.

11. The physical quantity sensor according to claim 1, wherein the physical quantity sensor is disposed in one package together with a control device.

* * * * *